United States Patent
Goto et al.

[11] Patent Number: 5,981,372
[45] Date of Patent: Nov. 9, 1999

[54] METHOD FOR MANUFACTURING A SEMICONDUCTOR DEVICE

[75] Inventors: Hiroshi Goto; Hiromi Hayashi, both of Kawasaki, Japan

[73] Assignee: Fujitsu Limited, Kanagawa, Japan

[21] Appl. No.: 08/759,619

[22] Filed: Dec. 5, 1996

Related U.S. Application Data

[62] Division of application No. 08/403,284, Mar. 13, 1995, abandoned.

[30] Foreign Application Priority Data

Mar. 17, 1994 [JP] Japan ................................. 6-47428

[51] Int. Cl.$^6$ ................................................. H01L 21/32
[52] U.S. Cl. ........................ 438/621; 438/598; 438/655; 438/738; 438/751
[58] Field of Search ................................. 438/598, 621, 438/735, 738, 751, 655, 157, 153, 154, 199, 290, 592; 257/412

[56] References Cited

U.S. PATENT DOCUMENTS

| | | | |
|---|---|---|---|
| 4,384,301 | 5/1983 | Tasch, Jr. et al. | 156/23 |
| 4,545,116 | 10/1985 | Lau | 29/591 |
| 4,657,628 | 4/1987 | Holloway et al. | 156/643 |
| 4,675,073 | 6/1987 | Douglas | 156/643 |
| 4,793,896 | 12/1988 | Douglas | 156/643 |
| 4,804,636 | 2/1989 | Groover, III et al. | 437/52 |
| 4,821,085 | 4/1989 | Haken et al. | 357/67 |
| 4,863,559 | 9/1989 | Douglas | 156/643 |
| 4,890,141 | 12/1989 | Tang et al. | 357/23.3 |
| 4,957,590 | 9/1990 | Douglas | 156/643 |
| 4,975,756 | 12/1990 | Haken et al. | 357/23.1 |
| 4,980,020 | 12/1990 | Douglas | 156/643 |
| 5,010,032 | 4/1991 | Tang et al. | 437/57 |
| 5,122,225 | 6/1992 | Douglas | 156/643 |
| 5,139,974 | 8/1992 | Sandhu et al. | 438/652 |
| 5,190,893 | 3/1993 | Jones, Jr. et al. | 437/192 |
| 5,319,245 | 6/1994 | Chen et al. | 257/915 |

FOREIGN PATENT DOCUMENTS 0002139 1/1990 Japan.

OTHER PUBLICATIONS

"Titanium Nitride Local Interconnect Technology for VLSI", Tang et al, IEEE Transactions on Electron Devices, vol. ED–34, No. 3, Mar. 1987, pp. 682–688.

"A High Performance 0.25–$\mu$m CMOS Technology: Idesign and Characterization", Chang et al, IEEE Transactions on Electron Devices, vol. 39, No. 4, Apr. 1992, pp. 959–966.

"A High–Performance 0.25 $\mu$m CMOS Technology: II–Technology", Davari et al, IEEE Transactions on Electron Devices, vol. 39, No. 4, Apr. 1992, pp. 967–975.

S. P. Murarka, "Refractory Silicides for Integrated Circuits", Journal of Vac. Sci. Tech., 17(4), Jul./Aug. 1980, pp. 775–792.

*Primary Examiner*—John F. Niebling
*Assistant Examiner*—Ha Tran Nguyen
*Attorney, Agent, or Firm*—Nikaido Marmelstein Murray & Oram LLP

[57] ABSTRACT

A metal utilized for forming a silicide film is left even after completion of the reaction to produce silicide. A conductive film made of a material other than the metal is grown on the metal. A local interconnection overlapping the silicide layer is formed by the conductive film and the metal remaining after formation of silicide.

8 Claims, 9 Drawing Sheets

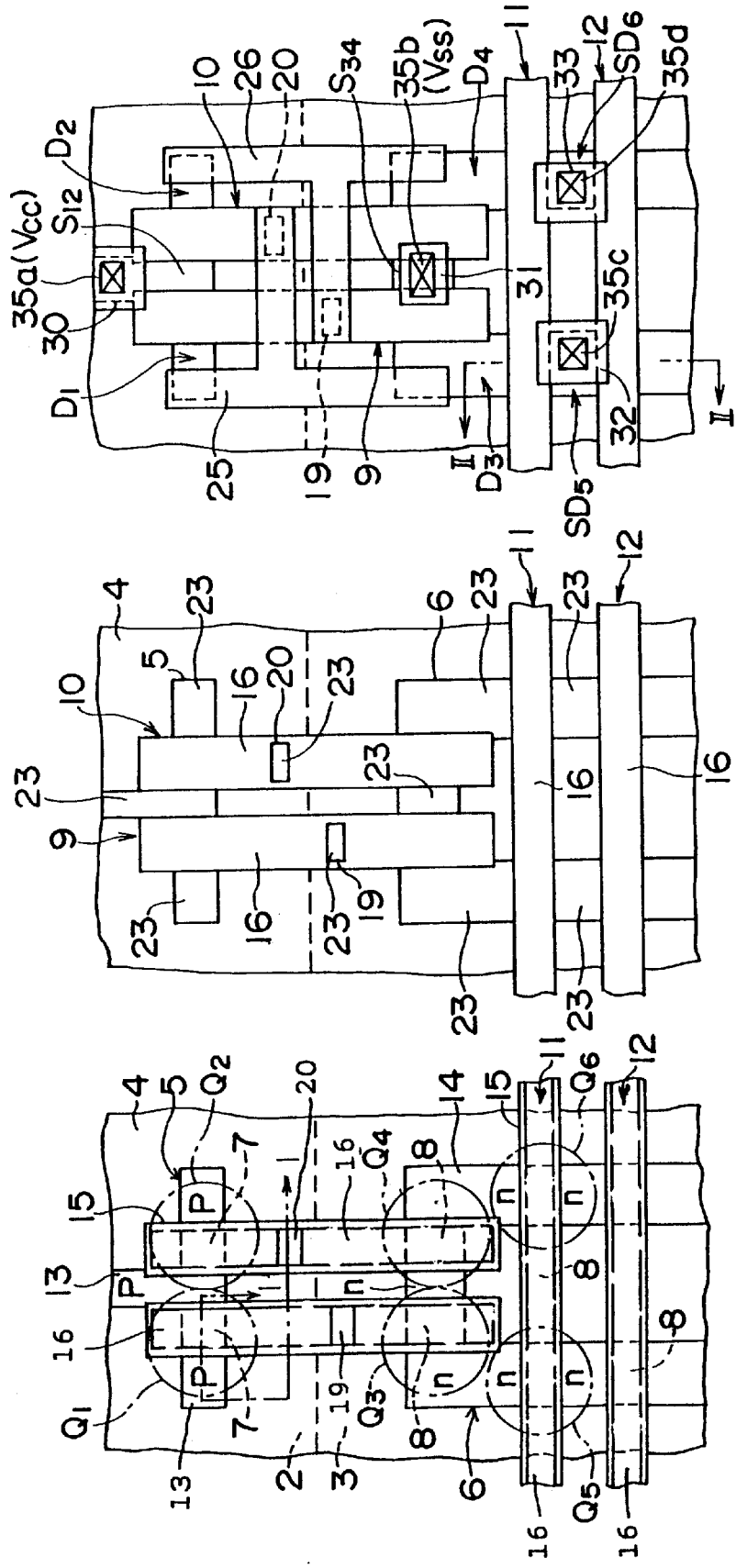

FIG.2B  P-TYPE IMPURITY ION

FIG.2C  P-TYPE IMPURITY ION

METHOD FOR MANUFACTURING A SEMICONDUCTOR DEVICE

This is a division of application Ser. No. 08/403,284 filed Mar. 13, 1995 abandoned.

BACKGROUND OF THE INVENTION

1. Field of the Invention

The present invention relates to a semiconductor device and a method for manufacturing the same. In particular, it relates to a semiconductor device provided with a local interconnection for making electrical connection among conductive regions and a method of manufacturing the same.

2. Description of the Prior Art

As the integration level of semiconductor devices including CMOS or Bi-CMOS circuits becomes high, silicide layers of titanium (Ti), cobalt (Co), nickel (Ni), platinum (Pt) and the like are generally utilized to form gate electrodes, source layers and drain layers for the purpose of reducing the parasitic resistances and the parasitic capacitances thereof.

Silicide layers can be formed by the salicide technique. Namely, after forming insulating sidewalls on the both sides of the gate electrodes, a metallic film is formed on the entirety of the transistor formation area, followed by reaction between the metallic film and silicon of the source electrode, the drain electrode and the gate electrode in order to form silicide layers respectively on the upper surface of the source electrode, the drain electrode and the gate electrode in a self-alignment manner. This method is described in U.S. Pat. No. 4,384,301.

Ti has been frequently utilized for formation of the silicide layer. It is known to introduce, nitrogen into the atmosphere for thermal treatment in order to form a silicide layer on the surface of the Ti film, as illustrated in U.S. Pat. No. 4,545,116. In accordance with this technique, a TiN film is successively formed after formation of a TiSi film in the nitrogen atmosphere and utilized for forming a local interconnection by making use of the TiN film, which is conductive and functions as a barrier layer for preventing impurity diffusion.

Local interconnection of this type are described also in U.S. Pat. No. 4,821,085, U.S. Pat. No. 4,804,636 and U.S. Pat. No. 4,657,628.

The advantages of a local interconnection have been frequently reported. For example, in U.S. Pat. No. 4,746,219, neighboring devices are connected by means of a local interconnection. Also, in U.S. Pat. No. 4,975,756, an SRAM is constructed by cross-coupling CMOS inverters by means of local interconnection. Furthermore, in U.S. Pat. Nos. 5,010,032 and 4,890,141, n-type and p-type polysilicon gate electrodes formed from a polysilicon layer are connected to each other by means of local interconnection in order to prevent two type impurities contained in the polysilicon layer from interdiffusion.

Meanwhile, when the TiN layer formed on the TiSi layer is utilized to form a fine local interconnection, the TiN layer has to be locally removed from the TiSi film, an oxide film or the like underlying surface by etching.

The removal of the unnecessary TiN film may be carried out, for example, by dry etching with a chlorine compound gas as illustrated in U.S. Pat. No. 4,793,896, U.S. Pat. No. 4,863,559 and U.S. Pat. No. 4,957,590 or by dry etching with a gas of freon system as illustrated in U.S. Pat. No. 4,675,073. However, in accordance with such etching, the selectivity ratio of TiN respective to the underlying surface made of TiSi or an oxide can not be sufficiently secured and often fluctuates during the etching process in any case of the conventional techniques.

In order to avoid the above problem, it has been proposed to switch the composition of the etchant gas in the middle of the etching process as described in U.S. Pat. No. 5,122,225. However, the control of the process becomes complicated to switch the composition of the etchant gas in the middle of the etching process, resulting in the need for a large process margin.

Also, an appropriate material for formation of a local interconnection can be selected in order to improve the selectivity ratio of TiN respective to the underlying silicide layer, as illustrated in U.S. Pat. No.4,980,020. In the description of the patent, a local interconnection is formed by forming the silicide layer with a different material by sputtering on the silicide layer.

When sputtering is utilized for the deposition of a local interconnection layer, the surface of the silicide layer has to be subjected to reverse RF sputtering etching treatment in order to decrease the contact resistance between the silicide layer and the local interconnection. However, since the very thin edge of the field oxide film surrounding the silicide layer is removed by the etching treatment, the junction within the semiconductor substrate comes to slightly appear after the removal of the very thin edge, resulting in the increased chance of causing junction leakage near the exposed surface.

Another technique for decreasing the contact resistance between the silicide layer and the local interconnection is described in the U.S. Pat. No. 5,190,893. In accordance with this technique, after formation of the silicide layer, a film for formation of a local interconnection is grown anew by making use of an appropriate material for improving the etching selectivity ratio thereof respective to the underlying silicide layer and patterned in the form of a local interconnection, followed by thermal treatment for nitrogenization in order to alloy the local interconnection with the underlying silicide layer, resulting in a decreased contact resistance.

In this case, although the contact resistance is certainly decreased, there is a possibility of accidentally increasing junction leakage of drain and source regions since the silicide layer tends to undergo reaction in nitrogen during the alloying process by thermal treatment.

As described above, while it is important to increase the etching ratio of a local interconnection more than that of the underlying silicide layer during patterning the local interconnection, it is effective for improving the selectivity ratio to make use of a material other than the silicide for forming the local interconnection. However, there is no report sufficiently discussing the technique to decrease the contact resistance between the silicide layer and the local interconnection without causing junction leakage at the periphery of the silicide layer.

SUMMARY OF THE INVENTION

It is an object of the present invention to provide a semiconductor device and a method for manufacturing the same with a local interconnection provided with a layered structure which produce no adverse effect to the underlying surface.

In accordance with the present invention, a metal utilized for forming a silicide film is left even after completion of the reaction to produce silicide. A conductive film made of a material other than the metal is grown on the metal. A local interconnection or a contact pad overlapping the silicide layer is then formed by the conductive film and the metal remaining after formation of silicide.

In this state, the silicide layer is protected by the silicide formation metal. Accordingly, when the local interconnection or the contact pad is patterned on the silicide layer, the etching selectivity ratio of the metal respective to the silicide layer is improved without causing shortcomings of damaging the silicide layers and insulating films located therearound, increasing the contact resistance.

BRIEF DESCRIPTION OF THE DRAWING

FIGS. 1A to 1F are plan views showing a method of manufacturing semiconductor devices in accordance with a first embodiment of the present invention.

FIGS. 2A to 2I are cross sectional views along I—I line of FIG. 1D showing a method of manufacturing semiconductor devices in accordance with a first embodiment of the present invention.

DETAILED DESCRIPTION OF THE PREFERRED EMBODIMENTS (First Embodiment)

The method of manufacturing SRAM cells will be explained hereinbelow in accordance with an embodiment of the present invention.

The description of the manufacturing method is first directed to the steps for forming the plane structure as illustrated in FIG. 1D.

Figure 1C:
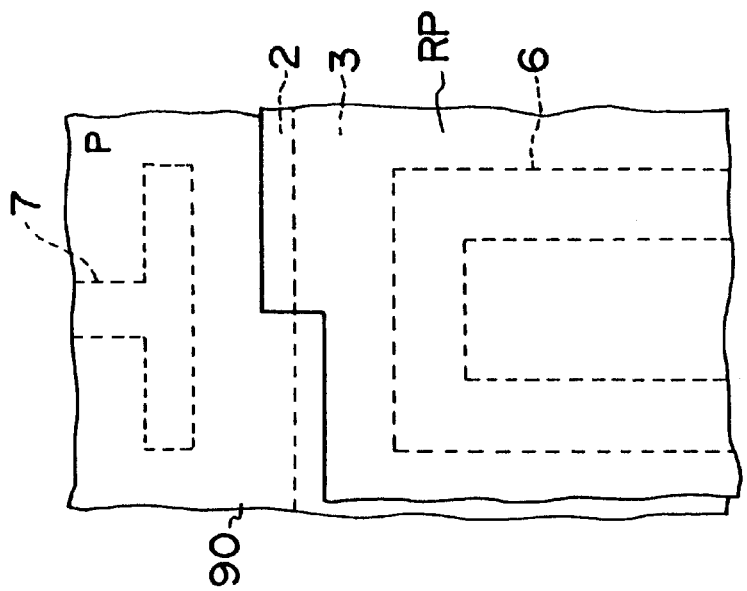
Figure 1B:
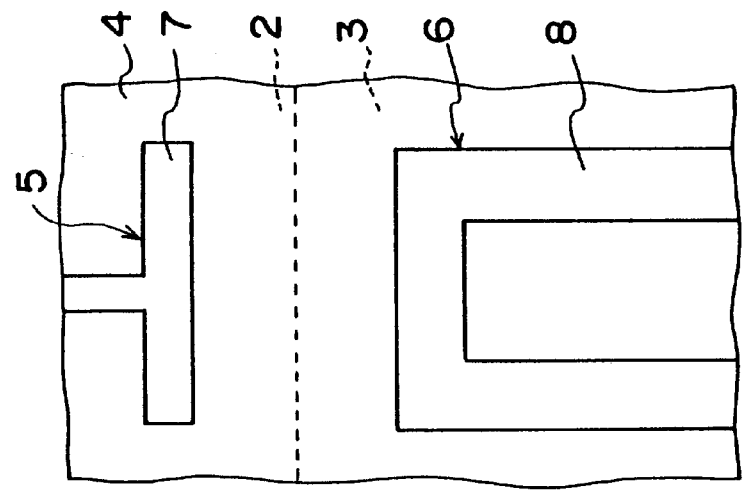
Figure 1A:
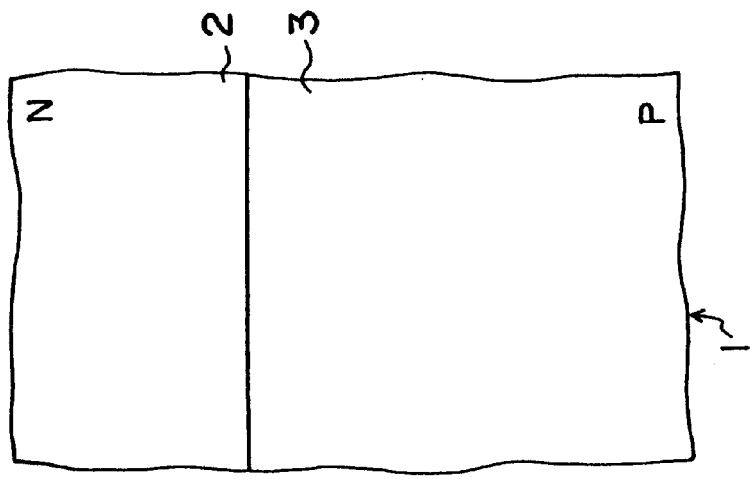

As shown in FIG. 1A, an N-well 2 and a P-well 3 are formed within a semiconductor substrate 1 made of silicon. A field oxide film 4 of $SiO_2$ is formed by LOCOS (local oxidation of silicon) on the surfaces of the N-well 2 and the P-well 3. A first active region 5 having a approximately "T"-shaped top view is defined by the field oxide film 4 in the N-well 2. Also, a second active region 6 having a "U"-shaped top view is defined by the field oxide film 4 in the P-well 3. The first active region 5 land the second active region 6 are located in the vertical direction in the figure with a certain distance therebetween.

In the subsequent steps described hereinbelow, a pair of p-type MOS transistors to be the load transistors $Q_1$ and $Q_2$ as illustrated in FIG. 1D are formed within the first active region 5 while four n-type MOS transistors to be the drive transistors $Q_3$ and $Q_4$ and the transfer transistors $Q_5$ and $Q_6$ as illustrated in FIG. 1D are formed within the second active region 6.

Next, the description is directed to the formation of conductive films to be the dual gate of the CMOS inverters.

After cleaning the surfaces of the N-well 2 in the first active region 5 and the P-well 3 in the second active region 6, gate insulating films 7 and 8 made of silicon oxide are formed on the surfaces by thermal oxidation to a thickness of 5 to 10 nm.

Next, an amorphous or polycrystalline silicon film 90 is formed on the field oxide film 4 and the first and second active regions 5 and 6 by means of CVD to a thickness of 150 to 250 nm, as shown FIG. 1C.

A resist film (not shown in the figure) is coated on the structure, exposed to light through an appropriate mask and developed to form a resist pattern RP virtually covering the P-well 3. The edge of the resist pattern RP passes across the boundary between the N-well 2 and the P-well 3 in the area between the first active region 5 and the second active region 6, as shown FIG. 1C. Furthermore, a p-type impurity such as boron ion-implanted into the part of the silicon film 90 not covered by the resist pattern RP. The silicon film 90 thus ion-implanted became a p-type silicon film.

Next, the resist pattern is replaced by another resist pattern. The another resist pattern is formed on the area of the silicon film 90 not covered by the resist pattern RP removed and is not formed on the other area. An n-type impurity such as arsenic, phosphorus, is ion-implanted into the part of the silicon film 90 not covered by the another resist pattern. The silicon film 90 thus ion-implanted become an n-type silicon film.

An $SiO_2$ film 16 is formed on the silicon film 90 to a thickness of 10 to 100 nm by means of CVD, after removing the resist pattern RP.

Furthermore, in the area between the first active region 5 and the second active region 6, the $SiO_2$ film 16 is patterned to form opening just above the boundary between the p-type silicon film and the n-type silicon film 90. The opening serves as openings 19 and 20 in which silicide layer of dual gates are formed, as shown FIG. 1D.

Next, the silicon film 90 and the $SiO_2$ film 16 are patterned by photolithography, thereby, two dual gates patterns 9 and 10 are made of the silicon film 90. The dual gate patterns 9 and 10 are separately formed in the form of stripes passing through the first and second active regions 5 and 6. These dual gate patterns 9 and 10 are formed in order to intersect the lateral line of the "T" of the first active region 5 at a right angle and stride across the bottom line of the "U" of the second active region 6.

Figure 2A:
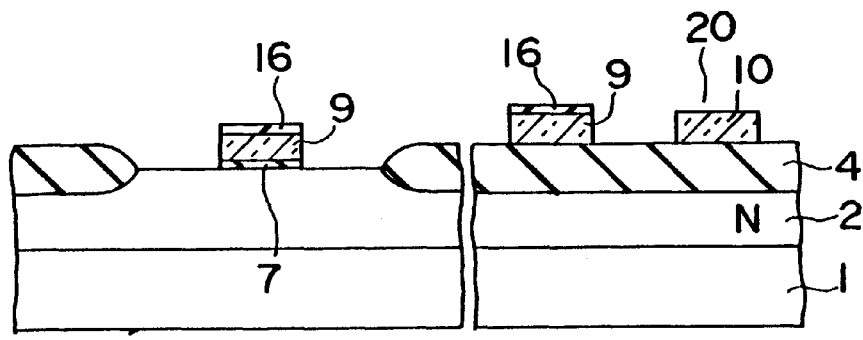
Figure 2A:
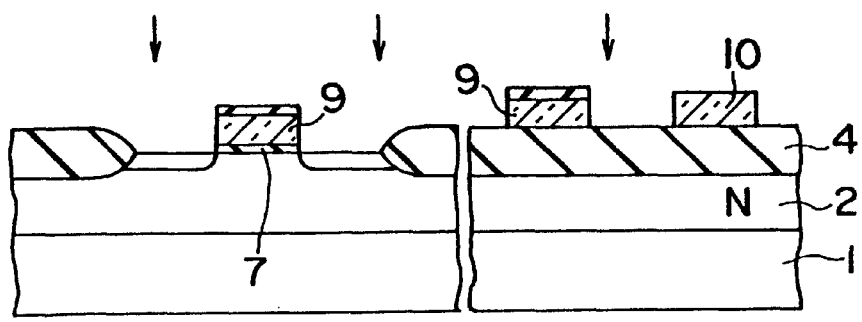
Figure 2A:
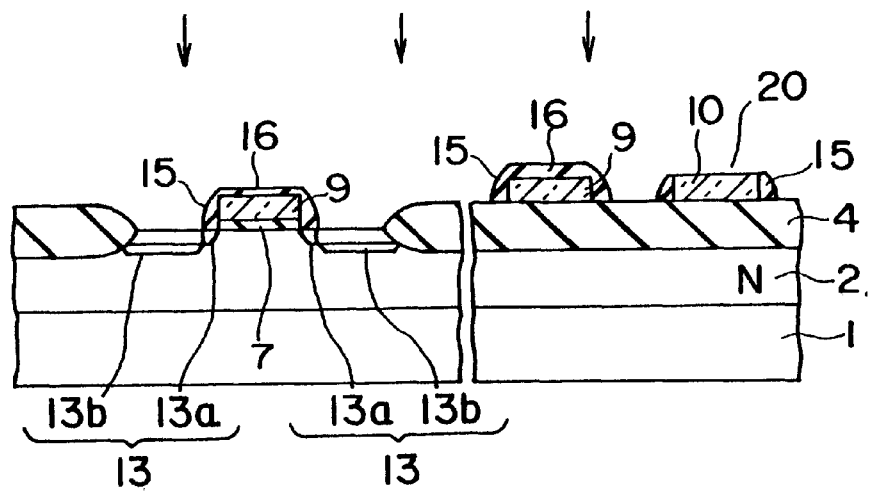

When the dual gate patterns 16 and 17 are formed, a word line pattern 11 is also formed at the same time passing over the both side parallel lines of the "U" of the second active region 6 and extending in the direction perpendicular to the dual gate patterns 16 and 17. FIG. 2A is a cross sectional view along I—I line of FIG. 1C.

Figure 4:
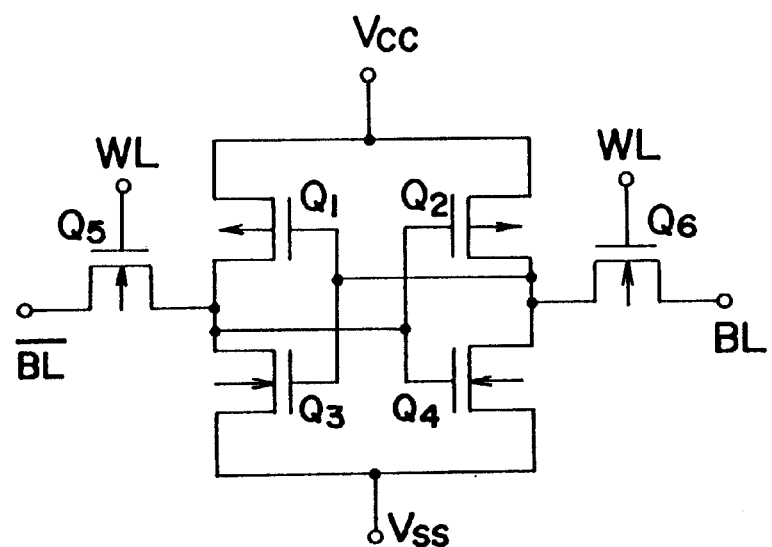
FIG. 4 is a circuit diagram showing an example of SRAM cells.

The portions of the dual gate patterns 9 and 10 overlying the first active region 5 serve as the gate electrodes of the load transistors $Q_1$ and $Q_2$ as illustrated in FIG. 4. Also, the portions of the dual gate patterns 9 and 10 overlying the second active region 6 serve as the gate electrodes of the drive transistors $Q_3$ and $Q_4$. Furthermore, the portions of the word line pattern 11 overlying the second active region 6 serves as the gate electrodes of the transfer transistors $Q_5$ and $Q_6$.

Meanwhile, a word line pattern 12 as illustrated in FIGS. 1C to 1F is the word line pattern of other SRAM cells and passes across the active regions of the other SRAM cells in parallel to the word line pattern 11.

After the formation of the dual gate patterns 9 and 10, the source region and the drain region of the MOS transistors having LDD structure is formed as follows.

First, a resist film (not shown in the figure) is coated on the structure, exposed to light through an appropriate mask and developed to form a resist pattern covering the P-well 3. Then, as illustrated in FIG. 2B, a p-type impurity such as boron is introduced into the first active region 5 through the dual gate patterns 9 and 10 as a mask to form shallow p-type impurity diffusion layers 13a defining a source region and a drain region. The impurity densities are $1 \times 10^{18}$ to $1 \times 10^{19}$ atoms/cm$^3$.

Next, the resist pattern is replaced by another resist pattern to substantially cover the N-well 2. An n-type impurity such as arsenic, phosphorus, is then ion-implanted into the second active region 6 to form shallow n-type impurity diffusion layers (not shown in the figure). The impurity densities are $1 \times 10^{18}$ to $1 \times 10^{19}$ atoms/cm$^3$.

Next, after forming an insulating film made of such as SiO$_2$ on the entirety by CVD to a thickness of 100 nm, insulating sidewalls 15 are formed on the sides of the dual gate patterns 9 and 10 and the word line patterns 11 and 12 by removing this insulating film by reactive ion etching (RIE) effected approximately in the vertical direction as illustrated in FIG. 1D and FIG. 2C.

After this step, a p-type impurity and an n-type impurity are separately introduced into the first and second active regions 5 and 6 as described above, followed by thermal treatment for activation of the impurities. By this procedure, as illustrated in FIG. 2C, deep p-type impurity diffusion layers 13b with an impurity density of $1 \times 10^{20}$ atoms/cm$^3$ are formed within the first active region 5 in the N-well 2 except for just under the insulating sidewalls 15 and the dual gate patterns 9 and 10. Also, deep n-type impurity diffusion layers (not shown in the figure) with an impurity density of $1 \times 10^{20}$ atoms/cm$^3$ are formed within the second active region 6 except for just under the insulating sidewalls 15 and the dual gate patterns 9 and 10 in the same manner.

By this process, there are formed n-type impurity diffusion layers 13 of an LDD structure in the opposite sides of the dual gate patterns 9 and 10 of the first active region 5 while p-type impurity diffusion layers 14 of an LDD structure are formed in the opposite sides of the dual gate patterns 9 and 10 of the second active region 6. These impurity diffusion layers 13 and 14 serve as source regions and drain regions.

The formation of the MOS transistors is then completed. Within the first active region 5 and the second active region 6, there are formed the load transistors $Q_1$ and $Q_2$, the drive transistors $Q_3$ and $Q_4$ and the transfer transistors $Q_5$ and $Q_6$.

Next, the description is directed to the process for forming silicide layers and local interconnection.

Figure 2D:
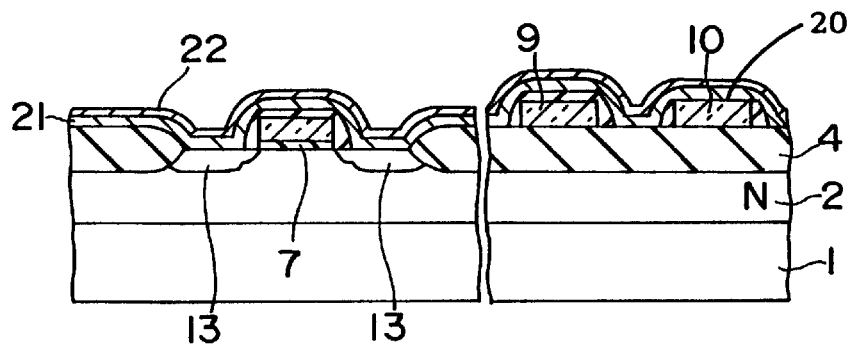

As illustrated in FIG. 2D, a cobalt (Co) film 21 and a metallic cap film 22 are formed on the substrate 1 by sputtering respectively to a thickness of 10 to 30 nm and to a thickness of 50 nm.

Figure 2E:
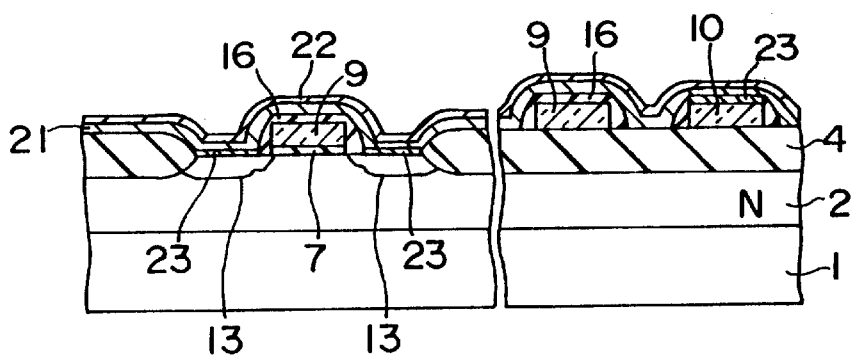

These metallic films are then heated at 600 to 700° C. to cause a reaction between cobalt and silicon contained in the N-well 2, the P-well 3 and the dual gate patterns 9 and 10. Cobalt silicide films 23 are formed on the surface of the first active region 5 except for the surface covered by the dual gate patterns 9 and 10 and formed on the dual gate patterns 9 and 10 in the openings 19 and 20 as illustrated in FIGS. 1E and 2E. The surface of the second active region 6 is coated with cobalt silicide films 23 in the same manner except for the surface covered by the dual gate patterns 9 and 10 and the word line pattern 11.

By this process, the p-type impurity regions and the n-type impurity regions in the dual gate patterns 9 and 10 are connected to each other through the cobalt silicide films 23.

Figure 2F:
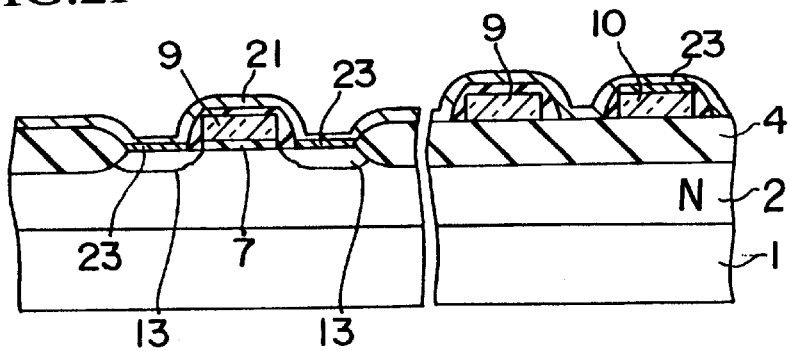

After this, as illustrated in FIG. 2F, the metallic cap film 22 is removed by a mixed solution of H$_2$O$_2$ and NH$_4$OH. The metallic cap film 22 is formed, for example, from titanium nitride (TiN) and provided only for the purpose of stabilizing the reaction to form silicide so that it may be dispensed with when the reaction is stabilized even without the metallic cap film 22.

Figure 2G:
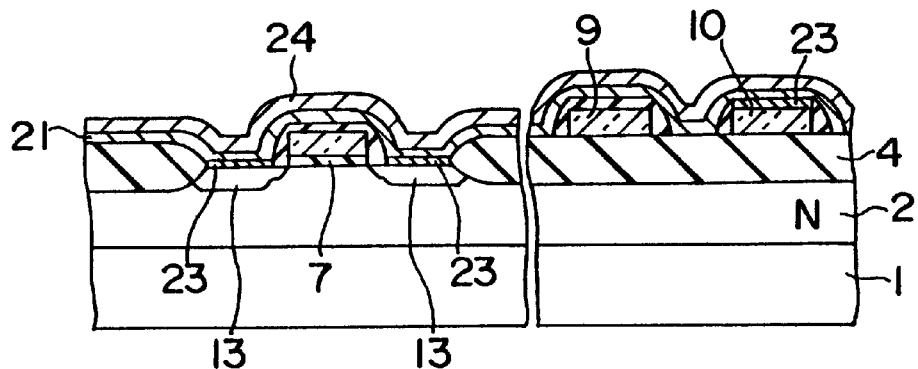

Next, as illustrated in FIG. 2G, a conductive film 24 made of a conductive material selected among from tungsten titanium (TiW), tungsten nitride (WN), tungsten (W), tungsten titanium nitride (TiWN), titanium nitride (TiN), a polycide and a silicide is formed over the cobalt film 21 and patterned by photolithography. The conductive film 24 is preferably formed from tungsten.

There possibly arise a problem that the contact resistance between the conductive film 24 and the cobalt film 21 increases clue to the presence of a natural oxide film formed on the cobalt film 21 before the formation of the conductive film 24. In this case, the undesirable oxide can be removed by subjecting the surface of the cobalt film 21 to reverse sputtering etching treatment at high frequency energy (RF energy) until the thickness of the cobalt film 21 is reduced to several nanometers, followed by sputtering for formation of the conductive film 24 without interval in the same vacuum condition. Any damage to the surfaces of the field oxide film 4, the N-well 2 and the P-well 3 by the reverse sputtering etching treatment can be avoided because the surfaces are protected by the cobalt film 21.

Figure 2H:
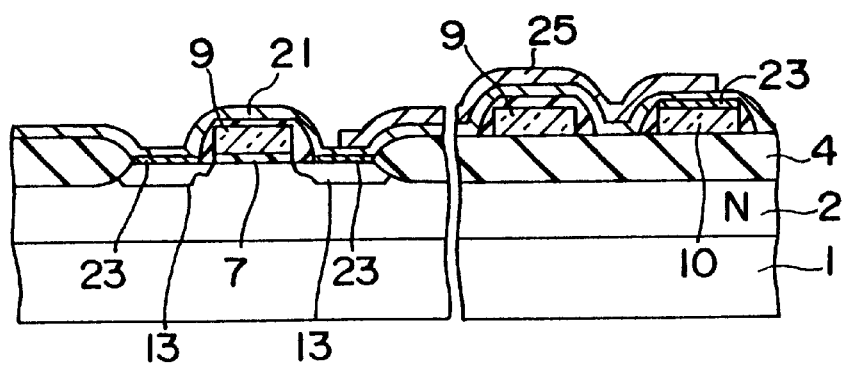

Next, as illustrated in FIGS. 1F and 2H, the conductive film 24 is selectively patterned by photolithography to form the local interconnection patterns 25 and 26. When the conductive film 24 is made of tungsten, the etching selectivity ratio thereof respective to the cobalt film 21 can be increased, for example, by employing anisotropic dry etching (RIE) with an etchant gas mainly composed of SF$_6$, leaving the cobalt film 21 alone.

The local interconnection pattern 25 (or 26) serves to connect the drain region $D_1$ (or $D_2$) of the load transistor $Q_1$ (or $Q_2$) and the drain region $D_3$ (or $D_4$) of the drive transistor $Q_3$ (or $Q_4$) to form the CMOS inverters, and is extended to the opening 20 (or 19) of the dual gate pattern 10 (or 9) over the dual gate pattern 9 (or 10) serving as the gate electrode of the drive transistor $Q_3$. The pair of the CMOS inverters are cross-coupled by this structure.

The structure may be thermal treated at 700° C. to 800° C. after the formation of the local interconnection patterns 25 and 26, if necessary, in order to accelerate the alloying reaction with the cobalt film 21.

At the same time as the local interconnection patterns 25 and 26 is patterned, contact pads 30 to 33 are formed on the common source region $S_{12}$ and therearound of the two load transistors $Q_1$ and $Q_2$, the common source region $S_{34}$ and therearound of the two drive transistors $Q_3$ and $Q_4$ and the source/drain regions $SD_5$ and $SD_6$ and therearound of the transfer transistors $Q_5$ and $Q_6$ to be connected to bit lines BL and $\overline{BL}$ as illustrated in FIG. 1F.

These contact pads 30 to 33 are formed in order to extend onto the upper surfaces of the dual gate patterns 9 and 10 and the word line patterns 11 and 12. By this structure, while part of the contact pads 30 to 33 overlaps the dual gate patterns 9 and 10 and the word line patterns 11 and 12, no direct contact is made therebetween because insulating films (such as the SiO$_2$ film 16 and the insulating sidewalls 15) have been formed on the upper surfaces of the dual gate patterns 9 and 10 and the word line patterns 11 and 12.

Figure 2I:
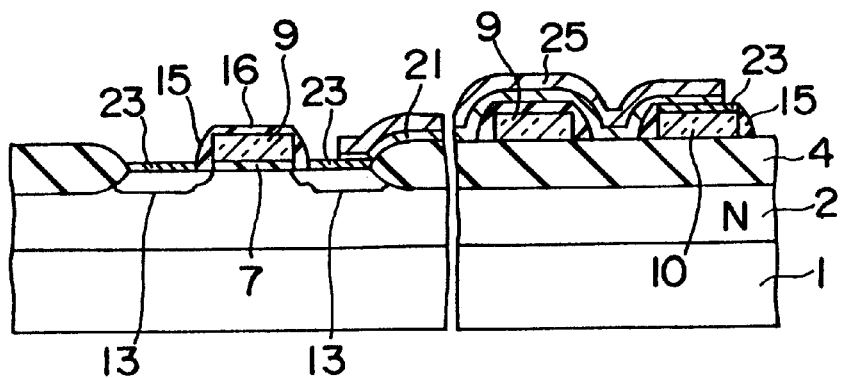

After patterning the conductive film 24 forming the contact pads 30 to 33 as described above, the cobalt film 21 is partially removed by wet etching with an etchant mainly composed of Hcl and $H_2O_2$, leaving the portions thereof coated with the pattern. The etching ratios of $CoSi_2$, $SiO_2$ and W are extremely small, when the etchant mainly composed of Hcl and $H_2O_2$ is used, so that only cobalt which has not reacted is selectively removed. The cross sectional view along I—I line of FIG. 1D is therefore as illustrated in FIG. 2I.

The cobalt film 21 thus remaining under the conductive film 24 functions as part of the local interconnection patterns 25 and 26 and the contact pads 30 to 33.

As a result, the process for forming the six transistors serving as an SRAM cell together with the local interconnection and the contact pads making necessary connection thereamong is completed. Next, explanation of the process for forming interconnection for power supply and bit lines is in order.

A first interlayer insulating film is formed by CVD to coat the above described six MOS transistors $Q_1$ to $Q_6$ and patterned by photolithography to provide a first contact hole 35a above the source region $S_{12}$ of the two load transistors $Q_1$ and $Q_2$ and a second contact hole 35b above the source region $S_{34}$ of the two drive transistors $Q_3$ and $Q_4$.

Next, a Vcc power line is formed on the first interlayer insulating film and connected to the source region $S_{12}$ of the to load transistors $Q_1$ and $Q_2$ through the first contact hole 35a. Also, a Vss power line is formed on the first interlayer insulating film and connected to the source region $S_{34}$ of the two drive transistors $Q_3$ and $Q_4$ through the second contact hole 35b.

Figure 3:
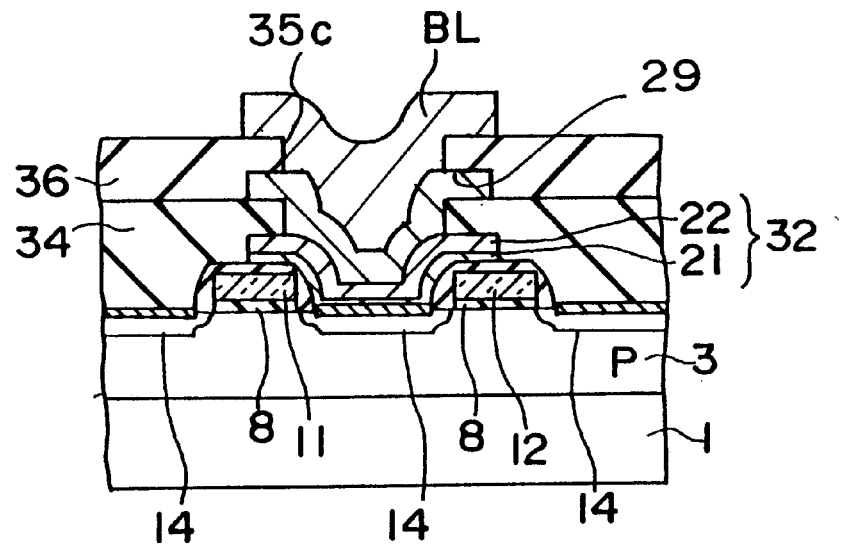
FIG. 3 is a cross sectional view along II—II line of FIG. 1E.

Furthermore, a second interlayer insulating film is formed on the first interlayer insulating film, the Vcc power line and the Vss power line, followed by opening contact holes 35c and 35d just above the source/drain regions $SD_5$, and SD. Bit lines BL and $\overline{BL}$ are formed and patterned thereon. The bit lines BL and $\overline{BL}$ are then connected to the source/drain regions $SD_5$ and $SD_6$ of the transfer transistors $Q_5$ and $Q_6$ through the contact holes 35c and 35d above the source/drain regions $SD_5$ and $SD_6$. The cross sectional view along II—II line of FIG. 1F is therefore as illustrated in FIG. 3. In FIG. 3, numeral 34 designates the first interlayer insulating film; numeral 36 designates the second interlayer insulating film; numeral 29 designates a second level contact pad connected to the contact pad 32 through the contact hole 35c above the source/drain region $SD_5$.

Since the contact pads 30 to 33 are located below the area for forming the contact holes 35a to 35d and making in contact not only with the common source region $S_{12}$ and $S_{34}$ and the source/drain regions $SD_5$ and $SD_6$ but also with the peripheries thereof so that there is secured margins of aligning the mask for formation of the contact holes and the like.

Meanwhile, in the process for forming the local interconnection patterns 25 and 26 and the contact pads 30 to 33, after formation of the silicide from the metallic film (the cobalt film 21) and silicon layer, the metallic film is not removed but subjected to the reverse sputtering etching treatment, followed by coating it with a conductive film made of a material other than the material forming the metallic film. Because of this, the surfaces of the field oxide film 4, the N-well 2 and the P-well 3 are not damaged by the reverse sputtering etching treatment, which would otherwise cause junction leakage damaged.

When the local interconnection patterns 25 and 26 and the contact pads are formed, the uppermost conductive film 24 is first selectively patterned, followed by removing with, the conductive film 24 as a mask, the silicide forming film (the cobalt film 21) having not become silicide. The silicide layers and the field oxide film are therefore not made thin.

As described above, the metallic film (cobalt film) serves as an etching stopper during selective etching of the conductive film made of another conductive material (e.g., tungsten) overlying the metallic film for forming the local interconnection patterns and the contact pads. The metallic film (cobalt film) serving as the etching stopper during formation of the local interconnection patterns is removed by an etchant which does not attack the underlying surfaces such as silicide, oxides. As a result, satisfactory local interconnection can be formed without causing overetching of the underlying surface during etching of silicide films, which had posed a serious problem in the conventional technique. Furthermore, because of the etching stopper layer (the cobalt layer), it becomes possible to avoid damage due to the reverse sputtering etching treatment, which is needed for forming the local interconnection by sputtering, resulting in stabilization of contact resistances even without thermal treatment. Even if thermal treatment is carried out, excessive reaction between the local interconnection and the silicide is prevented by the etching stopper layer so that there is not caused junction leakage.

(Second Embodiment)

In the above described embodiment, the contact pads 30 to 33 is formed on the source or drain regions of the MOS transistors. However, when the dimension of the pattern widths (the channel widths) of the dual gate patterns 9 and 10 becomes extremely decreased, it may be the case that the contact pads 30 and 31 get astride of the dual gate patterns 9 and 10 to reach to the source regions and the drain regions.

Figure 5A:
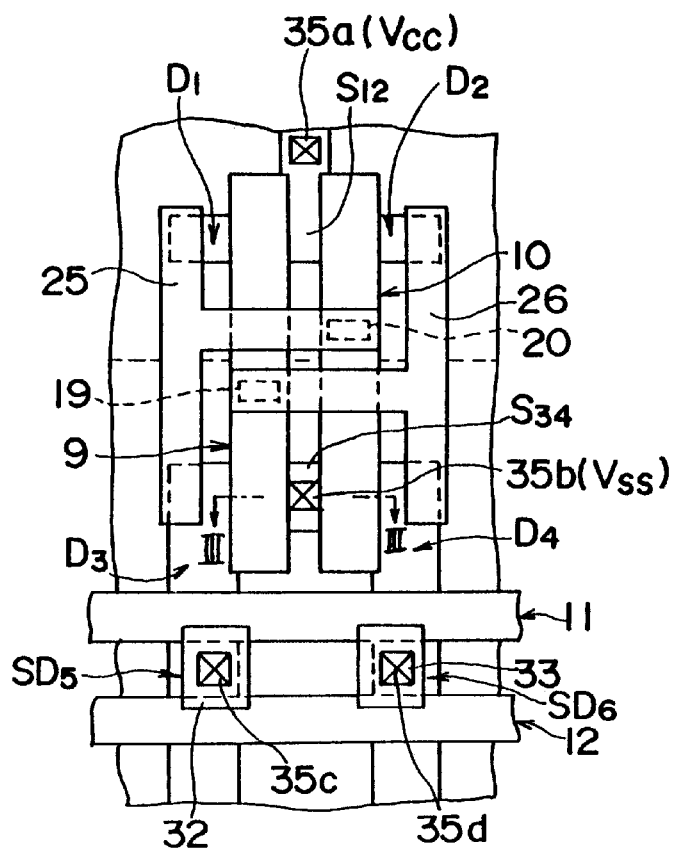
FIG. 5A is a plan views showing the structure of a second embodiment of the present invention.

In this case, only the contact pads 32 and 33 can be formed on the source/drain regions $SD_5$ and $SD_6$ in both sides of the word line patterns 11 and 12 as illustrated in FIG. 5A.

However, if the contact holes 35a and 35b are opened through the first interlayer insulating film 34 with no contact pad, the insulating film formed on the dual gate patterns 9 and 10 can possibly be etched during opening the contact holes.

First, after the formation of the local interconnection patterns 25 and 26 and the contact pads 32 and 33 is completed, the entire surface is coated with an aluminum oxide ($Al_2O_3$) film 41, followed by the formation of the first interlayer insulating film 34 made of SOG.

Figure 5B:
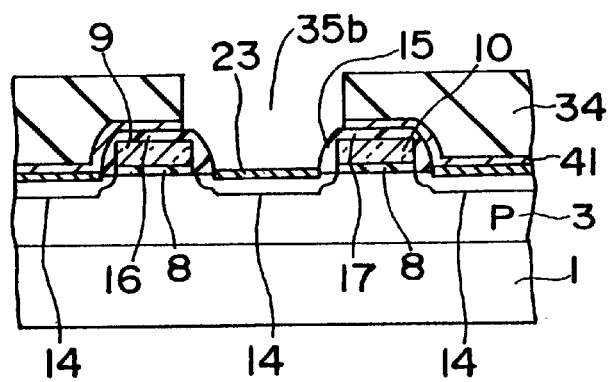
FIG. 5B is a cross sectional view along III—III line of FIG. 5A.

In accordance with this layered structure as illustrated in FIG. 5B, since the first interlayer insulating film 34 has etching selectivity respective to the aluminum oxide film 41, the insulating sidewalls 15 and the $SiO_2$ film 16 formed on the dual gate patterns 9 and 10 are not removed even if the contact holes 35a and 35b are opened at the location where no contact pad is provided. The source regions $S_{12}$ and $S_{34}$ are then exposed by selectively removing the aluminum oxide film 41 in the contact holes 35a and 35b. Meanwhile, the same effect can be expected when the aluminum oxide film 41 is replaced by a silicon nitride film. The cross sectional view along III—III line of FIG. 5B is therefore as illustrated in FIG. 5A.

(Third Embodiment)

In the initial embodiment, the contact pads 30 to 33 is formed on the source or drain regions of the MOS transistors. However, when the dimension of the pattern widths (the channel widths) of the dual gate patterns 9 and 10 and the word line patterns 11 and 12 becomes extremely decreased, it may be the case that the contact pads 30 to 33 get astride of the dual gate patterns 9 and 10 and the word line patterns 11 and 12 to reach to the source regions and the drain regions.

Figure 6A:
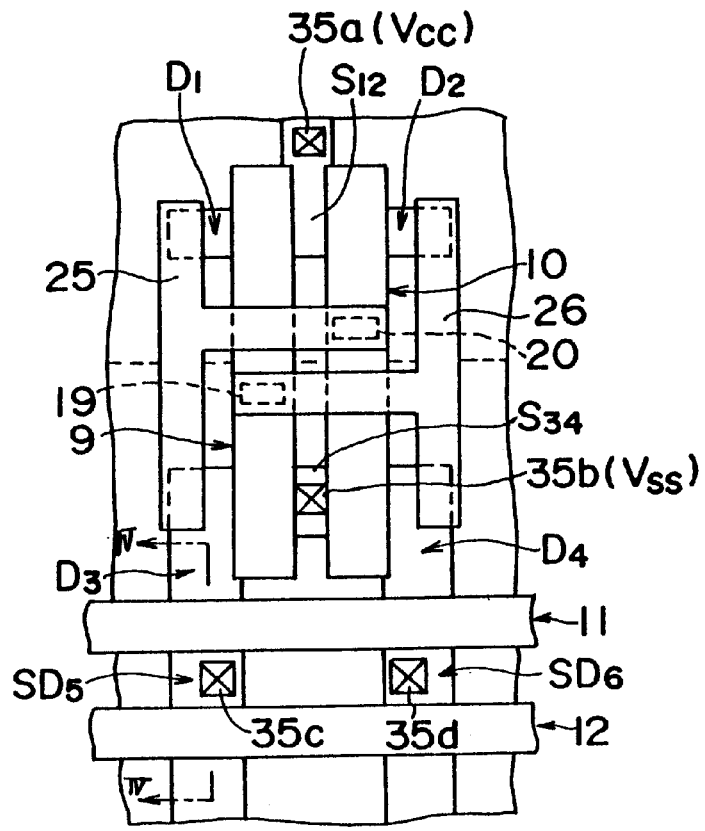
FIG. 6A is a plan views showing the structure of a third embodiment of the present invention.

In this case, formation of all the contact pads 30 to 33 can be dispensed with as illustrated in FIG. 6A.

However, if these contact holes are opened through the first interlayer insulating film 34 with no contact pad, the insulating films formed on the dual gate patterns 9 and 10 and the word line patterns 11 and 12 can possibly be etched during opening the contact holes. It is therefore preferred to perform the following process in addition.

First, after the formation of the local interconnection patterns 25 and 26 is completed, the entire surface is coated with an aluminum oxide ($Al_2O_3$) film 41, followed by the formation of the first interlayer insulating film 34 made of SOG.

Figure 6B:
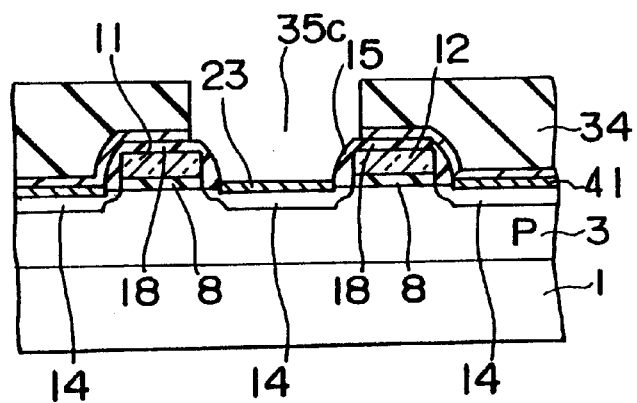
FIG. 6B is a cross sectional view along IV—IV line of FIG. 6A.

In accordance with this layered structure as illustrated in FIG. 6B, since the first interlayer insulating film 34 has etching selectivity to the aluminum oxide film 41, the insulating sidewalls 15 and the $SiO_2$ film 16 formed on the dual gate patterns 9 and 10 and the word line patterns 11 and 12 are not removed even if the contact holes 35a to 35d are opened at the location where no contact pad is provided. The source regions $S_{12}$ and $S_{34}$ and the source/drain regions $SD_5$ and $SD_6$ are then exposed by selectively removing the aluminum oxide film 41 in the contact holes 35a to 35d. Meanwhile, the same effect can be expected when the aluminum oxide film 41 is replaced by a silicon nitride film. The cross sectional view along IV—IV line of FIG. 6B is therefore as illustrated in FIG. 6A.

(Fourth Embodiment)

Figure 7A:
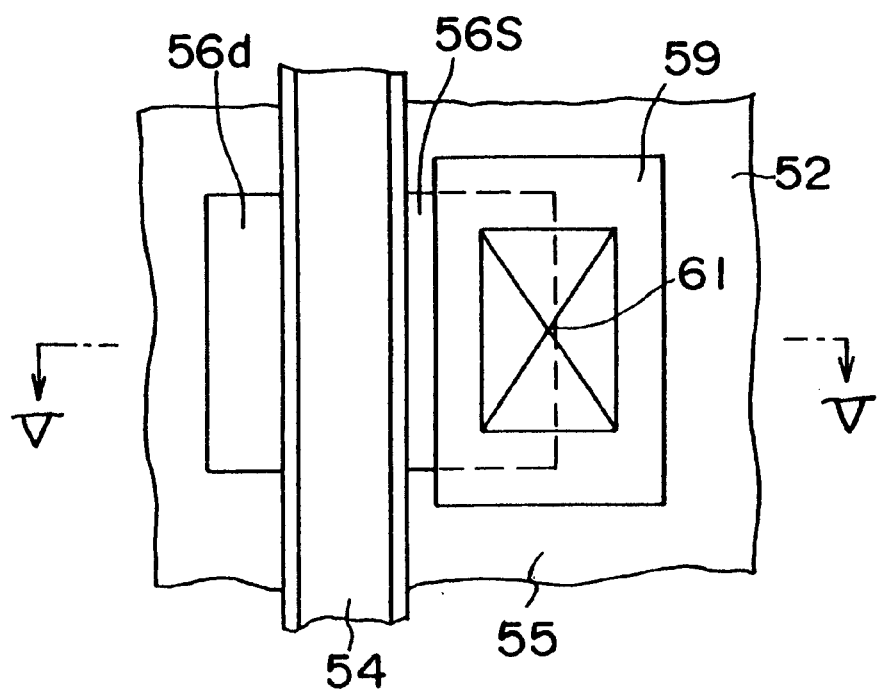
FIG. 7A is a plan views showing the structure of a fourth embodiment of the present invention.
Figure 7B:
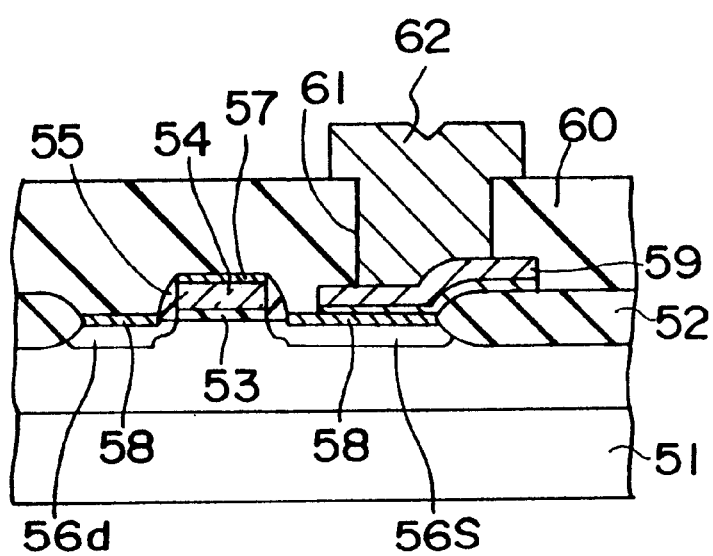
FIG. 7B is a cross sectional view along V—V line of FIG. 7A.

In the above described embodiments, the contact pads are formed together with the local interconnection in order to overlap the dual gate pattern and the word line patterns. The similar structure is applicable also to the case that a contact hole is opened through an overlying interlayer insulating film to make electric contact with an impurity diffusion layer to be a source or a drain, as illustrated in FIGS. 7A and 7B. FIG. 7B is a cross sectional view along V—V line of FIG. 7A.

In FIGS. 7A and 7B, a gate electrode 54 made of silicon is formed on a transistor formation area surrounded by the field oxide film 52 through a gate insulating film 53. The gate insulating film 53 is flanked by sidewalls 55. Also, a source layer 56s and a drain layer 56d in the form of LDD structure are formed by impurity diffusion in the both sides of the gate electrode 54.

The surfaces of the gate electrode 54, the source layer 56s and the drain layer 56d are coated with silicide layers 56d by the same process as described above. Furthermore, a contact pad 59 is formed from a cobalt layer and a tungsten layer stacked in a dual layer structure by the same process as described above.

The MOS transistor of this structure consisting of the gate electrode 54, the source layer 56s and the drain layer 56d is coated with an interlayer insulating film 60.

With this structure, the position of the contact hole 61 opened through the interlayer insulating film 60 just above the source layer 56s (or the drain layer 56d) can be displaced to overlap the field oxide film 52 within the area where the contact pad 59 is formed so that the alignment margin of the contact hole 61 is substantially increased.

Furthermore, the interconnection 62 formed on the interlayer insulating film 60 is certainly connected to the source layer 56s (or the drain layer 56d) through the contact hole 61.

By forming the contact pad 59 by the same process as the contact pads 30 to 33 of the first embodiment, no intolerable junction leakage flows through the source layer 56s and the drain layer 56d of the MOS transistor. The contact resistance between the contact pad and the source and drain layer 56s and 56d is substantially small.

Although not specifically shown in the figure, a local interconnection pattern is formed on the silicon substrate 51 at the same time as the contact pad 59 is formed.

(Other Embodiments)

Although cobalt is utilized to form silicide layers in the above described embodiments, other semi-noble metal, noble metals such as gold and platinum, refractory metals such as molybdenum and tantalum can be utilized instead for the same purpose. Particularly, those forming no nitride are preferred. However, the conductive material forming the local interconnection pattern has to be selected among from those having etching selectivity respective to the metal forming silicide layers.

Furthermore, in the above described embodiments, the SRAM cells are formed with a dual gate structure which is integrally formed to provide both the p-gate PMOS transistor and this n-gate NMOS transistor. However, it is also possible to form single gate PMOS and NMOS transistors.

Furthermore, although the local interconnection is applied to SRAMs in the above described embodiments, similar application is possible also for semiconductor devices of other types. Also, while the local interconnections are applied for the purpose of connecting impurity diffusion layers to electrodes formed on the field oxide film in the above described embodiments, a plurality of impurity diffusion layers can be connected to each other by local interconnections.

What is claimed is:

1. A method for manufacturing a semiconductor device comprising the steps of:

growing a cobalt metallic layer on a semiconductor layer at least within a device formation region;

forming an alloy layer between said semiconductor layer and said metallic layer on a surface of said semiconductor layer by heating;

forming a conductive laser from a material comprising no cobalt component on said metallic layer;

patterning said conductive layer to cover part of said alloy layer; and selectively etching said metallic layer which is not alloyed using said patterned conductive layer as an etching mask therein forming a local interconnection.

2. The method for manufacturing a semiconductor device according to claim 1, wherein said semiconductor layer is a silicon layer and said alloy layer is a silicide layer.

3. The method for manufacturing a semiconductor device according to claim 1, said conductive layer is made of one selected among from a group consisting of tungsten, a tungsten compound and a titanium compound.

4. The method for manufacturing a semiconductor device according to claim 1, wherein a cap layer is formed from a material other than that utilized to form said metallic layer after forming said metallic layer, and said cap layer is selectively removed before said heating step but after formation of said conductive layer.

5. The method for manufacturing a semiconductor device according to claim 4, said cap layer is made of titanium nitride and said conductive layer is made of one selected among from a group consisting of tungsten, a tungsten compound and a titanium compound.

6. The method for manufacturing a semiconductor device according to claim 1, wherein said conductive layer is formed by sputtering, and said method further comprises a step of etching a surface of said metallic layer by reverse sputtering before forming said conductive layer.

7. The method for manufacturing a semiconductor device according to claim 1, wherein said local interconnection interconnects a plurality of conductive regions through no contact hole.

8. The method for manufacturing a semiconductor device according to claim 1, wherein said patterned conductive layer and a portion of said metallic layer covered by said patterned conductive layer is a contact pad formed on an impurity diffusion layer.

* * * * *